United States Patent
Kennedy et al.

(10) Patent No.: US 6,326,611 B1
(45) Date of Patent: Dec. 4, 2001

(54) INTEGRATED MULTIPLE SENSOR PACKAGE

(75) Inventors: Adam M. Kennedy, Santa Barbara; Michael D. Jack, Goleta, both of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/406,501

(22) Filed: Sep. 28, 1999

(51) Int. Cl.⁷ .................................................... G01N 21/35
(52) U.S. Cl. ....................... 250/239; 250/343; 250/214.1
(58) Field of Search ........................... 250/214.1, 214 R, 250/226, 239, 343; 327/514

(56) References Cited

U.S. PATENT DOCUMENTS 5,721,430 * 2/1998 Wong ..................................... 250/343

* cited by examiner

Primary Examiner—Stephone B. Allen
(74) Attorney, Agent, or Firm—William C. Schubert; Glenn H. Lenzen, Jr.

(57) ABSTRACT

An integrated dual sensor package comprises a housing, a first sensor assembly and a second sensor assembly. The housing includes an internal vacuum chamber, a first window and a second window. The first window is transparent to a first wavelength of propagating energy and the second window is transparent to a second wavelength of propagating energy. The first sensor assembly and the second sensor assembly each have an active region responsive to a respective one of the first wavelength and second wavelength of propagating energy. The first sensor assembly and the second sensor assembly are each mounted within the vacuum chamber with the active region of each of the first sensor assembly and the second sensor assembly adjacently aligned with a respective one of said first window and said second window. The common alignment structure also serves as a common thermal interface to the external environment.

34 Claims, 3 Drawing Sheets

INTEGRATED MULTIPLE SENSOR PACKAGE

BACKGROUND OF INVENTION

1. Field of Invention

The present invention relates generally to packaging of microelectronic devices and more particularly to the packaging of multiple sensors within a thermally conductive vacuum package.

2. Description of the Related Art

A typical, known electronic viewing or sensing apparatus may utilize multiple sensors responsive to various wavelengths or spectrums of propagating wave energy. By viewing an object or scenescape with multiple sensors, the information obtained in a composite image of such object or scenescape derived from the images obtained by all such sensors is advantageously enhanced as compared to the information contained in a single image obtained by a single sensor. The energy wavelengths or spectrums that each sensor is responsive to and the number and combination of said sensors is limitless. The selection of the sensors, and the wavelengths and spectrums to which they are responsive, is determined by the application of the apparatus utilizing such sensors.

For example, a single viewing apparatus may presently utilize one sensor responsive to wavelengths in a first energy spectrum and another sensor responsive to wavelengths in a second energy spectrum. An object or scenescape, when viewed with each sensor, will allow the apparatus to develop an image of the energy emitted in each spectrum from the object or scenescape, and also combine each image into a composite image. Each image as well as the composite image conveys information of the object or scenescape which may then be utilized for further processing by other devices or for human observation.

For the composite image to convey reliable information, the relative alignment of one sensor to the other must be precisely controlled. However, the current state-of-the-art in packaging of such sensors disadvantageously limits the precision by which such sensors utilized by the viewing apparatus may be aligned to each other. This disadvantage and limitation arises from the necessity first to mount the sensor within a sensor package prior to its incorporation within the viewing apparatus.

The need for the sensor package arises from the nature of microelectronic sensors. The sensor is fabricated on a semiconductor chip or substrate, typically silicon or gallium arsenide. An active region of the sensor resides on an exposed surface of the chip. It is the active region upon which the propagating wave energy is incident. The active region may for example be a two dimensional array of active microelectronic devices which are all responsive to the same selected wavelengths or spectrums of wave energy. Each active device develops an electrical signal as a function of the wave energy incident upon it.

The sensor chip is mounted on a motherboard on which it shares common address and data busses with other chips to utilize and process the signals developed by the active region of the sensor. For example each active device within the active region, when addressed, has its electrical signal switched to the data bus, as is well know in the art.

The electrical signals developed by the sensing devices in the active region of the sensor may be temperature dependent or the sensor itself may require active cooling in order for them to operate properly. Therefore, for most sensors, it is important to provide the correct thermal environment, such as temperature stabilization, cooling or thermal isolation, in order for them to operate. For example, when using micro thermal sensors, thermal stability is very important. The thermal stability for these types of sensors needs to be very accurately controlled, otherwise thermal variations in the sensor substrate may cause false signals and images, or a lack of signal to noise ratio will result. For other types of sensors, such as infrared HgCdTe sensors, they must be cooled below ambient temperature in order for the signal to be higher than the noise in the detection, whereas in other types of sensors, such as visible CCD's, the detector needs to be cooled in order to remove the heat generated in the sensor. Also, for the new class of tiny ($50\mu \times 50\mu$) detectors to operate, they need to be thermally isolated to eliminate any convective heat transfer and substantially to reduce the conductive heat transfer to the detector element.

Temperature stabilization is accomplished by mounting the motherboard on an obverse surface of a thermal transfer substrate. Mounted to the reverse surface of the thermal transfer substrate are the thermoelectric cooler elements that make up the TE cooler. The combination of the motherboard with the sensor mounted thereon, and the thermal transfer substrate with the motherboard and thermoelectric cooler elements mounted thereto provides a sensor assembly. The sensor assembly is then mounted on a thermally conductive base within the sensor package to conduct heat between the sensor assembly and the ambient environment external of the sensor package.

Thermal isolation is accomplished by mounting the sensor assembly in the sensor package, and then evacuating the internal chamber of the package of gaseous elements. This eliminates all convective heat transfer. Accordingly, the sensor package may also contain at least one getter for removing such gaseous elements from within the internal chamber and maintaining the vacuum.

It is also necessary that the sensor assembly be precisely located within the package. So that wave energy may impinge on the active region, the package also contains a window transparent to the spectrum of energy to which the active region of the sensor is responsive. The package is then mounted on the apparatus utilizing such sensor. For an apparatus that utilizes multiple sensors, the package for each sensor must also be aligned with the package for each other sensor.

To accomplish such alignment, the sensor package is provided with alignment indicia, also referred to as datum. The same indicia are typically used for alignment of the sensor assembly within the package as well as referencing alignment of the package to other packages. It is known that tolerance errors will exist for the alignment of each sensor assembly to its respective package and that further tolerance errors will exist for the alignment of each package to another package. All of these tolerance errors will be additive into an overall alignment offset error for each sensor to another sensor. For example in an apparatus utilizing two sensors, the alignment offset error of the sensors to each other will be determined by the adding the tolerance error of each sensor assembly to its respective package, and the tolerance error of the packages to each other. Of course, these tolerance errors may have both positive and negative values. Statistically, the range of overall alignment offset error for all of the devices built in a manufacturing run should demonstrate a Gaussian, or normal, distribution. Those apparatus having an overall offset error above or below a threshold may be unacceptable. It is in these potentially unacceptable devices where the individual tolerance errors were all primarily negative or positive.

It would therefore be highly advantageous to provide a novel sensor package that reduces the range of overall offset error occurring in a manufacturing run. It would also be highly advantageous to provide a sensor package that provides for the alignment of multiple sensor assemblies in a single package.

SUMMARY OF THE INVENTION

It is therefore an object of the present invention that overcomes one or more disadvantage and limitations of the prior art hereinabove enumerated.

It is a primary object of the present invention to provide a sensor package in which multiple sensors may be mounted.

It is an important object of the present invention to provide a sensor package in which multiple sensors may be aligned with respect to each other.

According to the present invention, an integrated sensor package comprises a housing into which a plurality of sensor assemblies may be mounted. The housing includes an internal vacuum chamber, and a plurality of windows. Each window is transparent to its own selected spectrum of propagating wave energy. Each of the sensor assemblies has an active region responsive to its own selected spectrum of propagating wave energy. The sensor assemblies are each mounted within the vacuum chamber with the active region of each of the sensor assemblies adjacently aligned with a respective one of the windows which is transparent to the energy to which the active region adjacent thereto is responsive.

In one particular aspect of the present invention, the sensor package may include a platform or base carried within the housing in the vacuum chamber. The platform has a first surface and a second surface. A first sensor assembly having an active region may be mounted to the first surface and a second sensor assembly having an active region may be mounted to the second surface. The housing may include a peripheral wall, a first window housing and a second window housing. The peripheral wall has a first edge and a second edge. The first window housing having a first window is hermetically attached to the first edge and the second window housing having a second window is hermetically attached to the second edge. The active region of each of the first and second sensor is respectively disposed adjacent the first and the second window. Each window is transparent to the energy to which the active region adjacent thereto is responsive. The housing may further include a flange extending outwardly from the peripheral wall, the flange containing alignment indicia for referencing alignment of the sensor assemblies within the housing and further for referencing alignment of the package with other sensor packages.

An advantage of the present invention is that by providing multiple sensors in a single package, the number of packages is reduced in a multiple sensor apparatus. A further advantage in reducing the number of packages is the reduction in number of other hardware associated with each package, such as getters.

Another advantage of the present invention is that by providing multiple sensors in a single package, an apparatus requiring multiple sensors may have only one such package mounted thereto, obviating the need for alignment of separate packages. A further advantage is that since each sensor in a single package is aligned to the same indicia, offset errors between individual sensors in the same package are minimized.

These and other objects, advantages and features of the present invention will become readily apparent to those skilled in the art from a study of the following Description of the Preferred Embodiment when read in conjunction with the attached Drawing and appended claims.

DESCRIPTION OF THE PREFERRED EMBODIMENT

Figure 1:
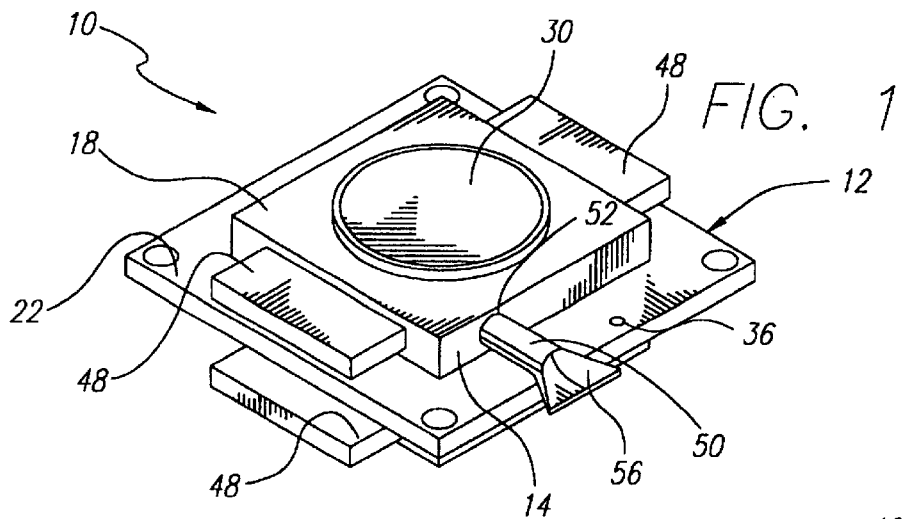
FIG. 1 is a perspective view of an integrated dual sensor package constructed according to the principles of the present invention.
Figure 2:
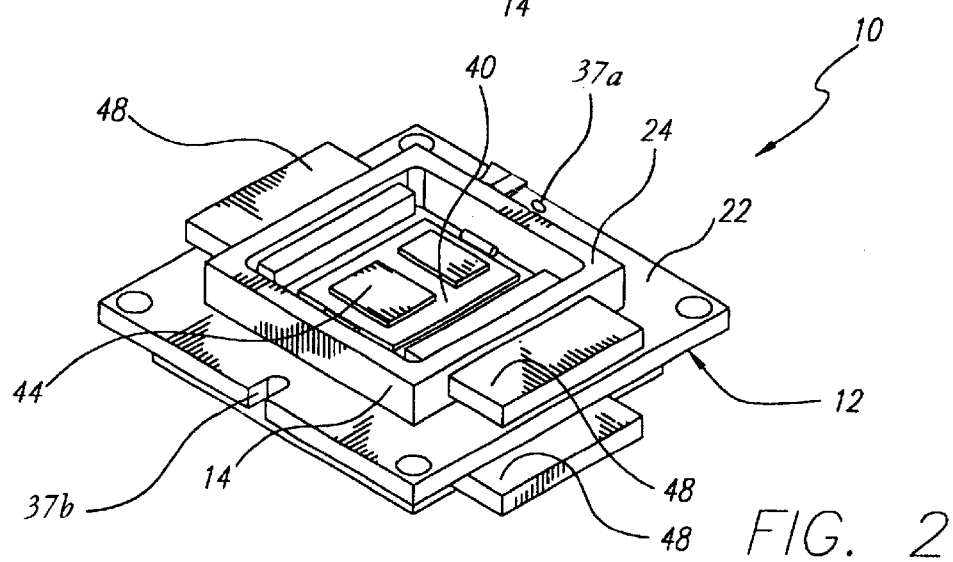
FIG. 2 is a fragmented perspective view of the top portion of the sensor package of FIG. 1.
Figure 3:
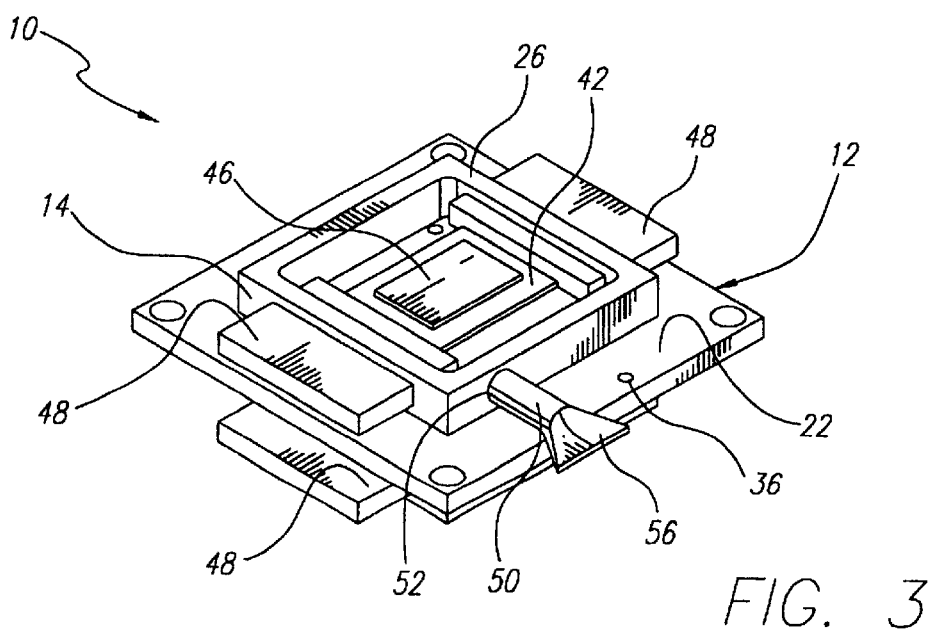
FIG. 3 is a fragmented perspective view of the bottom portion of the sensor package of FIG. 1.
Figure 4:
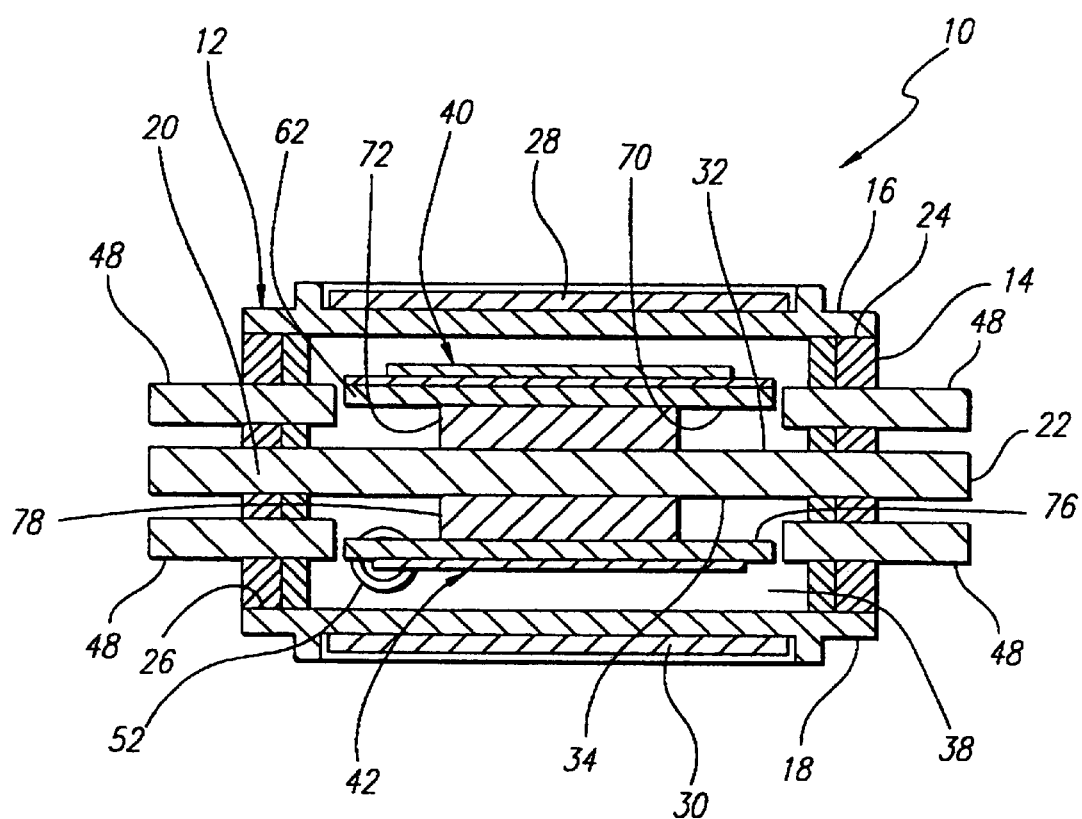
FIG. 4 is a cross sectional view of the sensor package taken along 4—4 of FIG. 1.
Figure 5:
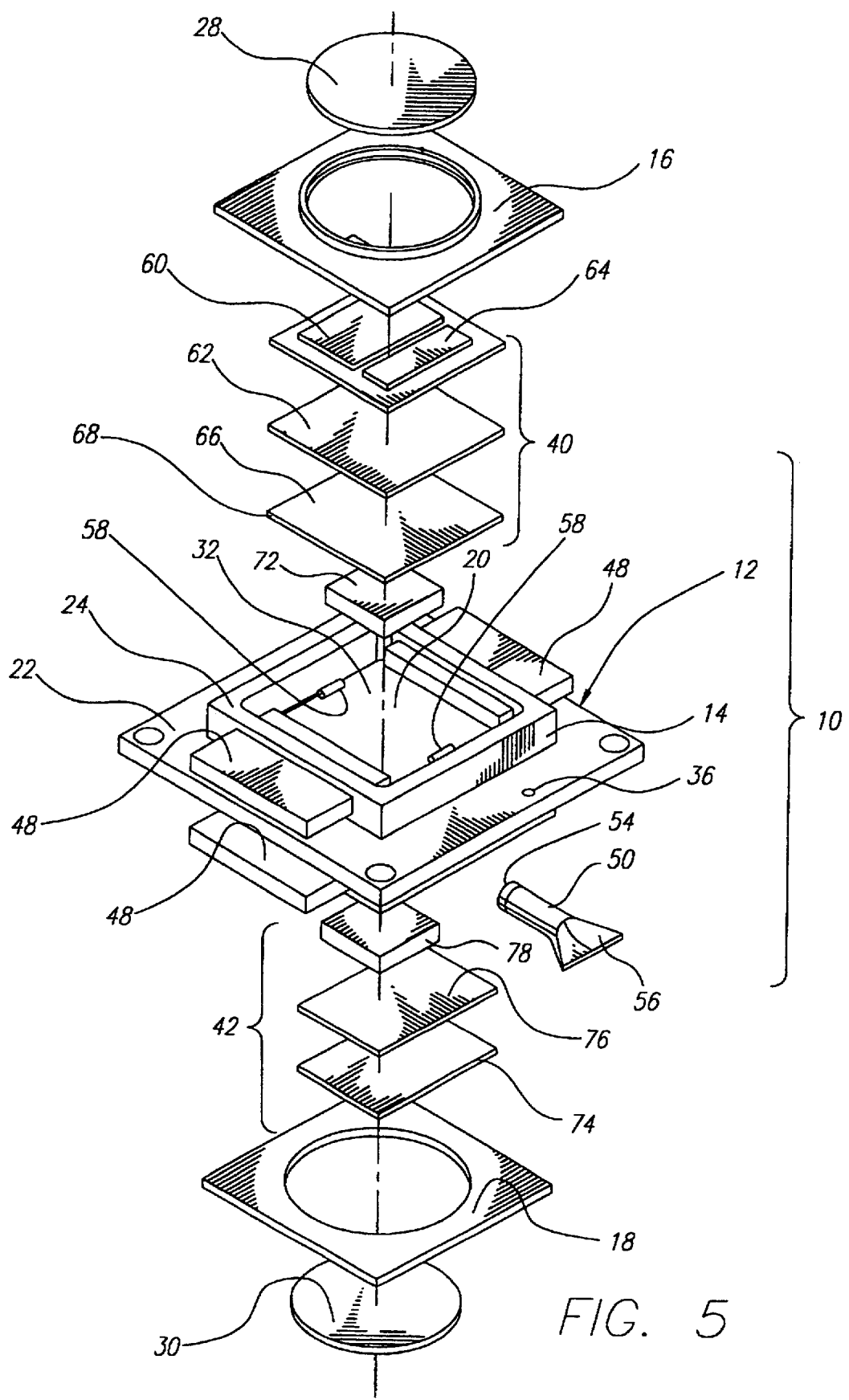
FIG. 5 is an exploded view of the sensor package of FIG. 1.

Referring now to FIGS. 1–5, there is shown an integrated sensor package 10 constructed according to the principles of the present invention. The integrated sensor package 10 includes a housing 12 having a peripheral wall 14, the first window housing 16, a second window housing 18, a generally planar base 20 and the flange 22.

The peripheral wall 14 has a first edge 24 and a second edge 26. The first window housing 16 is co-extensive with the peripheral wall 14 and hermetically attached to the first edge 24 and the second window housing 18 is co-extensive with the peripheral wall 14 and hermetically attached to the second edge 26. The first window housing 16 has a first window 28 transparent to a first energy spectrum and the second window housing 18 has a second window 30 transparent to a second energy spectrum. An energy spectrum as used herein shall mean either a single wavelength or a defined range of wavelengths.

The base 20 extends normally inwardly from and co-extensively with the peripheral wall 14. The planar base 20 has a first surface 32 and a second surface 34 opposite the first surface 32. The flange 22 extends outwardly from the peripheral wall 14 and has indicia 36 thereon. Generally, the indicia 36 may include holes 37a and slots 37b, with at least one hole 37a and at least one slot generally being required for alignment. The peripheral wall 14, the first window housing 16 and the second window housing 18 define a vacuum chamber 38 within the housing 12. Although the peripheral wall is shown in the Drawing as being rectangular, the construction of the housing 12 need not be limited to such rectangular shape. It is within the ordinary skill of those in the art to construct the housing 12 and peripheral wall 14 in any such shape as required by the application of the integrated dual sensor package 10. For example the peripheral wall may be arcuate or polygonal.

A first sensor assembly 40 is carried on the first surface 32 at a location referenced by the indicia 36. A second sensor assembly 42 is carried on the second surface 34 at a location reference by the indicia 36. Each of the first sensor assembly 40 and the second sensor assembly 42 has an active region 44,46 responsive to a respective one of the first energy spectrum and the second energy spectrum. The active region 44, 46 of each of the first sensor assembly 40 and the second sensor assembly 42 are adjacently aligned with a respective one of the first window 28 and the second window 30.

In a preferred embodiment of the present invention, the base 20 and the flange 22 lie on a common plane. The base 20 and the flange 22 may further be in thermal communication with each other to facilitate heat transfer between each sensor assembly 40,42, to a point external of the housing 12. Furthermore, the peripheral wall 14, the base 20 and the flange 22 may be of unitary construction. The base 20 and the flange 22 provide a common high thermal conductivity medium to draw out excess heat generated in the sensor assemblies 40 and 42.

Completing the construction of the package 10, the package 10 further includes at least one electrical feed through bus 48 disposed in the housing 12 and hermetically sealed thereto. The feed through bus 48 is operatively coupled to each of the first sensor assembly 40 and the second sensor assembly 42. Where multiple feed through busses 48 are utilized, as seen in the Figures, each sensor assembly 40,42, may be associated with a respective one of the feed through busses 48.

A pinch off tube 50 is also disposed through the housing 12. The housing 12 further has a bore 52 in which the pinch off tube 50 is hermetically attached. The pinch off tube 50 as a first end 54 disposed in communication with the chamber 38 and a second and 56 adaptable for connection to a vacuum source (not shown). The second end 56 of the pinch off tube 50 is further sealingly crimped subsequent to the evacuation of the chamber 38. Finally, the package 10 may further include at least one getter 58 disposed within the housing 12. The getter 58 upon being active is operative, as is well known in the art, to remove gaseous elements from the chamber 38 to maintain the quality of the vacuum within the vacuum chamber 38 over the useful life of the integrated sensor package 10.

Although the first sensor assembly 40 and the second sensor assembly 42 may be any suitable sensor assemblies, to demonstrate the utility of the present invention, two exemplary sensor assemblies described below. It is to be understood that the construction of the exemplary sensors assemblies described below is presented so that those skilled in the art may obtain a better understanding of the utility of the present invention, and that other sensor assemblies may be utilized, or that the construction of the below described sensor assemblies may vary, such as having their respective elements arranged in a different order as below described, or having substituted or additional elements.

The first sensor assembly 40 includes a first sensor chip 60, which includes the hereinabove described active region 44. The first sensor chip 60 is mounted on a first motherboard 62. Also on the first motherboard 62 is other circuitry, such as an analog digital converter 64, which is coupled to a common data bus with the first sensor chip 60. The first motherboard 62 is mounted to an obverse surface 66 of a thermal transfer substrate 68. Mounted to a reverse surface 70 of the thermal transfer substrate 68 is a first thermo-electric cooler 72. These components of the first motherboard 62 with the first sensor chip 60 mounted thereto, the thermal transfer substrate and the first thermo-electric cooler 72 comprise the first sensor assembly 40. This assembly is then mounted, as hereinabove described, on the first surface 32 of the base 20 at a location referenced to the indicia 36.

The second sensor assembly 42 includes a second sensor chip 74 mounted on a second motherboard 76. In the second sensor assembly 42, it is seen that a second thermo-electric cooler 78, similar to the first thermo-electric cooler 72, may also be mounted directly to the underside of the second motherboard 76. Again the second sensor assembly 42 is mounted on the base 20 as hereinabove described. Each electrical feed through 48 allows for bi-directional electrical signals to be communicated between respective ones of the first sensor assembly 40 and the second sensor assembly 42 and another device at a point external of the package 10.

Since the first sensor assembly 40 and the second sensor assembly 42 are mounted within the same package 10 and referenced to the same indicia 36, any alignment offset errors between the first sensor assembly 40 and the second sensor assembly 42 are minimized as compared to the prior art. In the prior art wherein each sensor assembly is mounted within its own package, the alignment offset error between any two sensors would then be additive of all alignment errors between each package and the alignment error of each sensor within its package. Furthermore, the common high thermal conductivity medium provided by the base 20 and the flange 22 draws excess heat from the sensor assemblies 40, 42 and the associated thermo-electric coolers 72, 78.

There has been hereinabove described an exemplary preferred embodiment of an integrated sensor package. Those skilled in the art may now make numerous uses of and departures from the hereinabove described embodiments without departing from the inventive concepts disclosed herein. Accordingly, the present invention is to be defined solely by the scope of the following claims and their permissible equivalents.

What we claim as our invention is:

1. An integrated multiple sensor package for containing a plurality of operative sensor assemblies wherein each of said sensor assemblies includes an active region, said integrated multiple sensor package comprising:

a housing having an internal vacuum chamber, and a plurality of windows transparent to differing spectrums of propagating energy; and means for mounting each of said sensor assemblies within said chamber wherein said active region of each of said sensor assemblies is adjacently disposed a respective one of said windows said means for mounting including a platform carried by said housing in said chamber, said platform having a first surface and a second surface, first ones of said sensor assemblies and second one of said sensor assemblies being mounted respectively to said first surface and said second surface.

2. An integrated multiple sensor package as set forth in claim 1 further comprising means for aligning placement of each of said sensor assemblies within said vacuum chamber.

3. An integrated multiple sensor package for containing a plurality of operative sensor assemblies wherein each of said sensor assemblies includes an active region, said integrated multiple sensor package comprising:

a housing having an internal vacuum chamber, and a plurality of windows transparent to differing spectrums of propagating energy;

means for mounting each of said sensor assemblies within said chamber wherein said active region of each of said sensor assemblies is adjacently disposed a respective one of said windows; and means for aligning placement of each of said sensor assemblies within said vacuum chamber wherein said aligning means includes a continuous flange extending outwardly from said housing, said flange having indicia to which alignment of each of said sensor assemblies is referenced.

4. An integrated multiple sensor package for containing a plurality of operative sensor assemblies wherein each of said sensor assemblies includes an active region, said integrated multiple sensor package comprising:

a housing having an internal vacuum chamber, and a plurality of windows transparent to differing spectrums of propagating energy;

means for mounting each of said sensor assemblies within said chamber wherein said active region of each of said sensor assemblies is adjacently disposed a respective one of said windows; and means for electrically connecting to said sensor assemblies to provide bi-directional electrical signals between said sensor assemblies and a point external of said housing.

5. An integrated multiple sensor package as set forth in claim 4 wherein said connecting means includes an electrical feedthrough bus disposed through said housing and hermetically sealed thereto, said feedthrough bus being operatively coupled to said sensor assemblies.

6. An integrated multiple sensor package for containing a plurality of operative sensor assemblies wherein each of said sensor assemblies includes an active region, said integrated multiple sensor package comprising:

a housing having an internal vacuum chamber, and a plurality of windows transparent to differing spectrums of propagating energy;

means for mounting each of said sensor assemblies within said chamber wherein said active region of each of said sensor assemblies is adjacently disposed a respective one of said windows; and means for evacuating gaseous matter from said chamber.

7. An integrated multiple sensor package as set forth in claim 6 wherein said evacuating means includes a pinch-off tube disposed through said housing, said housing further having a bore to which said tube is hermetically attached, said tube having a first end disposed in communication with said chamber and a second end adaptable for connection to a vacuum source and further sealingly crimped subsequent to evacuation of said chamber.

8. An integrated multiple sensor package for containing a plurality of operative sensor assemblies wherein each of said sensor assemblies includes an active region, said integrated multiple sensor package comprising:

a housing having an internal vacuum chamber, and a plurality of windows transparent to differing spectrums of propagating energy;

means for mounting each of said sensor assemblies within said chamber wherein said active region of each of said sensor assemblies is adjacently disposed a respective one of said windows; and means for gettering gaseous elements from said chamber.

9. An integrated multiple sensor package as set forth in claim 8 wherein said getter means includes at least one getter disposed within said housing, said getter upon being active being operative to remove gaseous elements from said chamber.

10. An integrated dual sensor package comprising:

a housing having an internal vacuum chamber, a first window transparent to a first spectrum of propagating energy and a second window transparent to a second spectrum of propagating energy;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy; and means for mounting each of said first sensor assembly and said second sensor assembly in said chamber wherein said active region of each of said first sensor assembly and said second sensor assembly is disposed adjacent to a respective one of said first window and said second window, said mounting means including a platform carried by said housing in said chamber, said platform having a first surface and a second surface opposite said first surface, said first sensor assembly and said second sensor assembly being mounted respectively to said first surface and said second surface.

11. An integrated multiple sensor package as set forth in claim 10 further comprising:

a housing having an internal vacuum chamber, a first window transparent to a first spectrum of propagating energy and a second window transparent to a second spectrum of propagating energy;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy;

means for mounting each of said first sensor assembly and said second sensor assembly in said chamber wherein said active region of each of said first sensor assembly and said second sensor assembly is disposed adjacent to a respective one of said first window and said second window; and means for gettering gaseous elements from said chamber.

12. An integrated multiple sensor package as set forth in claim 11 wherein said getter means includes at least one getter disposed within said housing, said getter upon being active being operative to remove gaseous elements from said chamber.

13. An integrated multiple sensor package as set forth in claim 10 further comprising:

a housing having an internal vacuum chamber, a first window transparent to a first spectrum of propagating energy and a second window transparent to a second spectrum of propagating energy;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy;

means for mounting each of said first sensor assembly and said second sensor assembly in said chamber wherein said active region of each of said first sensor assembly and said second sensor assembly is disposed adjacent to a respective one of said first window and said second window; and means for evacuating gaseous matter from said chamber.

14. An integrated multiple sensor package as set forth in claim 13 wherein said evacuating means includes a pinch-off tube disposed through said housing, said housing further having a bore to which said tube is hermetically attached, said tube having a first end disposed in communication with said chamber and a second end adaptable for connection to a vacuum source and further sealingly crimped subsequent to evacuation of said chamber.

15. An integrated dual sensor package comprising:

a housing having an internal vacuum chamber, a first window transparent to a first spectrum of propagating energy and a second window transparent to a second spectrum of propagating energy, wherein said housing includes:

a peripheral wall having a first edge and a second edge: and a first window housing and a second window housing, each of said first window housing and said second window housing being coextensive with said peripheral wall and hermetically attached to a respective one of said first edge and said second edge, said first window and said second window being disposed in a respective one of said first window housing and said second window housing;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy; and means for mounting each of said first sensor assembly and said second sensor assembly in said chamber wherein said active region of each of said first sensor assembly and said second sensor assembly is disposed adjacent to a respective one of said first window and said second window.

16. An integrated dual sensor package as set forth in claim 15 wherein said peripheral wall is rectangular.

17. An integrated dual sensor package as set forth in claim 15 wherein said mounting means includes:

a platform carried by said housing in said chamber, said platform having a first surface and a second surface opposite said first surface, said first sensor assembly and said second sensor assembly being mounted respectively to said first surface and said second surface.

18. An integrated multiple sensor package as set forth in claim 15 wherein said connecting means includes an electrical feedthrough bus disposed through said housing and hermetically sealed thereto, said feedthrough bus being operatively coupled to each of said first sensor assembly and said second sensor assembly.

19. An integrated dual sensor package comprising:

a housing having an internal vacuum chamber, a first window transparent to a first spectrum of propagating energy and a second window transparent to a second spectrum of propagating energy;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy;

means for mounting each of said first sensor assembly and said second sensor assembly in said chamber wherein said active region of each of said first sensor assembly and said second sensor assembly is disposed adjacent to a respective one of said first window and said second window; and means for aligning placement of each of said first sensor assembly and said second sensor assembly within said vacuum chamber.

20. An integrated dual sensor package as set forth in claim 19 wherein said aligning means includes a continuous flange extending outwardly from said housing, said flange having indicia to which alignment of each of said first sensor assembly and said second sensor assembly are referenced; and said flange also provides a common thermal interface for both sensor assemblies to the external mounting flange.

21. An integrated multiple sensor package comprising:

a housing having an internal vacuum chamber, a first window transparent to a first spectrum of propagating energy and a second window transparent to a second spectrum of propagating energy;

a first sensor assembly and a second sensor assembly, each of said first sensor assembly and said second sensor assembly having an active region, said active region of said first sensor assembly and said second sensor assembly being responsive to a respective one of said first spectrum and said second spectrum of propagating energy;

means for mounting each of said first sensor assembly and said second sensor assembly in said chamber wherein said active region of each of said first sensor assembly and said second sensor assembly is disposed adjacent to a respective one of said first window and said second window; and means for electrically connecting to each of said first sensor assembly and said second sensor assembly to provide bi-directional electrical signals between each of said first sensor assembly and said second sensor assembly and a point external of said housing.

22. An integrated dual sensor package comprising:

a housing including an internal vacuum chamber, a first window transparent to a first spectrum of propagating energy and said second window transparent to a second spectrum of propagating energy, wherein said housing includes:

a peripheral wall having a first edge and a second edge: and a first window housing and a second window housing, each of said first window housing and said second window housing being coextensive with said peripheral wall and hermetically attached to a respective one of said first edge and said second edge, said first window and said second window being disposed in a respective on of said first window housing and said second window housing; and a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window.

23. An integrated dual sensor package as set forth in claim 22 wherein said peripheral wall is rectangular.

24. An integrated dual sensor package comprising:

a housing including an internal vacuum chamber, a first window transparent to a first spectrum of propagating energy and said second window transparent to a second spectrum of propagating energy;

a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window; and a platform carried by said housing in said chamber, said platform having a first surface and a second surface opposite said first surface, said first sensor assembly and said second sensor assembly being mounted respectively to said first surface and said second surface.

25. An integrated dual sensor package comprising:

a housing including an internal vacuum chamber, a first window transparent to a first spectrum of propagating energy and said second window transparent to a second spectrum of propagating energy;

a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window; and a continuous flange extending outwardly from said housing, said flange having indicia to which alignment of each of said first sensor assembly and said second sensor assembly are referenced.

26. An integrated multiple sensor package comprising:

a housing including an internal vacuum chamber, a first window transparent to a first spectrum of propagating energy and said second window transparent to a second spectrum of propagating energy;

a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window; and an electrical feedthrough bus disposed through said housing and hermetically sealed thereto, said feedthrough bus being operatively coupled to each of said first sensor assembly and said second sensor assembly.

27. An integrated multiple sensor package comprising:

a housing including an internal vacuum chamber, a first window transparent to a first spectrum of propagating energy and said second window transparent to a second spectrum of propagating energy;

a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window; and a pinch-off tube disposed through said housing, said housing further having a bore to which said tube is hermetically attached, said tube having a first end disposed in communication with said chamber and a second end adaptable for connection to a vacuum source and further sealingly crimped subsequent to evacuation of said chamber.

28. An integrated multiple sensor package comprising:

a housing including an internal vacuum chamber, a first window transparent to a first spectrum of propagating energy and said second window transparent to a second spectrum of propagating energy;

a first sensor assembly and a second sensor assembly, each of said first sensor assembly and said second sensor assembly being mounted within said housing in said vacuum chamber and each further having an active region responsive to a respective one of said first spectrum and said second spectrum of propagating energy, said active region of each of said first assembly and said second assembly being adjacently aligned with a respective one of said first window and said second window; and at least one getter disposed within said housing, said getter upon being active being operative to remove gaseous elements from said chamber.

29. An integrated sensor package comprising:

a housing including a peripheral wall having a first edge and a second edge, a first window housing hermetically attached to said first edge and having a first window transparent to a first energy spectrum, a second window housing hermetically attached to said second edge and having a second window transparent to a second energy spectrum, a generally planar base extending normally inwardly from and coextensively with said peripheral wall and having a first surface and a second surface, and a flange extending outwardly from said peripheral wall and having indicia thereon, said peripheral wall, said first window housing and said second window housing defining a vacuum chamber;

a first sensor assembly carried by said first surface at a location referenced by said indicia and a second sensor assembly carried by said second surface at a location referenced by said indicia, each of said first sensor assembly and said second sensor assembly having an active region responsive to a respective one of said first energy spectrum and said second energy spectrum, said active region of each of said first sensor assembly and said second sensor assembly being adjacently aligned with a respective one of said first window and said second window.

30. An integrated sensor package as set forth in claim 29 wherein said base and said flange lie on a common plane.

31. An integrated sensor package as set forth in claim 29 wherein said base, said peripheral wall and said flange are of unitary construction.

32. An integrated multiple sensor package as set forth in claim 29 further comprising:

an electrical feedthrough bus disposed through said housing and hermetically sealed thereto, said feedthrough bus being operatively coupled to each of said first sensor assembly and said second sensor assembly.

33. An integrated multiple sensor package as set forth in claim 29 further comprising:

a pinch-off tube disposed through said housing, said housing further having a bore to which said tube is hermetically attached, said tube having a first end disposed in communication with said chamber and a second end adaptable for connection to a vacuum source and further sealingly crimped subsequent to evacuation of said chamber.

34. An integrated multiple sensor package as set forth in claim 29 further comprising:

at least one getter disposed within said housing, said getter upon being active being operative to remove gaseous elements from said chamber.

* * * * *